United States Patent [19]
Jay et al.

[11] Patent Number: 5,910,958
[45] Date of Patent: Jun. 8, 1999

[54] AUTOMATIC GENERATION OF TEST VECTORS FOR SEQUENTIAL CIRCUITS

[75] Inventors: Christian Y. Jay, Valbonne; Franck J. Poirot, Antibes, both of France

[73] Assignee: VLSI Technology, Inc., San Jose, Calif.

[21] Appl. No.: 08/539,887

[22] Filed: Oct. 6, 1995

Related U.S. Application Data

[63] Continuation of application No. 08/265,702, Jun. 24, 1994, abandoned, which is a continuation of application No. 07/745,038, Aug. 14, 1991, abandoned.

[51] Int. Cl.$^6$ .................................................. G01R 31/28
[52] U.S. Cl. ........................................ 371/27.1; 371/27.4
[58] Field of Search .......................... 371/27.1, 23, 21.1, 371/22.1, 22.2, 27.4, 17.5, 17.2

[56] References Cited

U.S. PATENT DOCUMENTS

| | | | |
|---|---|---|---|
| 4,625,310 | 11/1986 | Mercer | 371/15 |
| 4,627,057 | 12/1986 | Schmidt et al. | 371/27 |
| 4,969,148 | 11/1990 | Nadeau-Dostie et al. | 371/27 |
| 4,991,176 | 2/1991 | Dahbura et al. | 371/27 |
| 5,163,016 | 11/1992 | Hafel et al. | 364/578 |
| 5,257,268 | 10/1993 | Agrawal et al. | 371/27 |
| 5,291,495 | 3/1994 | Udell, Jr. | 371/22.3 |
| 5,297,066 | 3/1994 | Mayes | 364/578 |
| 5,588,008 | 12/1996 | Nakata | 371/27 |

OTHER PUBLICATIONS

A. K. Susskind Lehigh University, "Diagnostics for Logic Networks", IEEE Spectrum, Oct. 1973, pp. 40–44.

Melvin Breuer, "New Concepts in Automated Testing of Digital Circuits", G. Musgrave editor, Computer–Aided Design of Digital Electronic Circuits and Systems, North–Holland Publishing Company, ECSC, EEC, EAEC, Brussels & Luxemburg 1979, pp. 57–79.

Verma et al, "Automatic Test–Generation and Test–Varification of Digital Systems", Burroughs Corporation Mission Viejo, California, pp. 149–157.

"An Implicit Enumeration Algorithm to Generate Tests for Combinational Logic Circuits", P. Goel, IEEE Transactions on Computers, vol. C–30, No. 3, Mar. 1981.

"A Logic Structure for LSI Testability," E. Eichelburger and T. Williams, Proceedings 14th Design Automation Conference, Jun. 1977, pp. 358–364.

"Dynamic Testing of Control Units," C. Robach and G. Saucier, IEEE Transactions on Computers, vol. C–27, Jul. 1978, pp. 617–623.

"Dynamic Testing of Control Units," C. Bobach and G. Saucier IEEE Transactions on Computers, vol. 27, Jul. 1978, pp. 617–662.

"Functional Level Primitives in Test Generation," M. Breuer and A. Friedman, IEEE Transactions on Computers, vol. C–29, pp. 223 and 224, Mar. 1980.

"Synthesis and Optimization Procedures for Fully and Easily Testable Sequential Machines," S. Davadas and K. Ma, 1988, International Test Conference, paper 31.1, pp. 621–630.

(List continued on next page.)

*Primary Examiner*—Hoa T. Nguyen
*Attorney, Agent, or Firm*—Burns, Doane, Swecker & Mathis LLP

[57] ABSTRACT

The disclosure concerns the automatic generation of test vectors for a sequential circuit which is expressible as a finite state machine having a combinatorial part and sequential elements. A functional generation of test vectors is performed using a high level functional specification of the finite state machine. Fault simulation may be used to provide a list of possible faults not covered by the vectors generated functionally. A structural generation performed on the combinatorial part in respect of the listed faults provides test vectors for all the remaining faults except those which are due to redundancy in the circuit. The high level specification can be modified for the purpose of test generation without modifying its functionality to add transitions corresponding to the structurally generated vectors and the functional generation may be performed on the modified specification to provided a final set of test vectors. The disclosed method enables the automatic generation of text vectors without any design modification and providing a high fault coverage with fewer design constraints.

9 Claims, 6 Drawing Sheets

OTHER PUBLICATIONS

"An Imcomplete Scan Design Approach to Test Generation for Sequential Machines," H. Ma et al., 1988 International Test Conference, paper 35.2, pp. 730–734.

"Digital Systems Testing and Testable Design", Abramovici et al., (Computer Science Press 1990) pp. 131–155.

"Redundancies and Don't Cares in Sequential Logic Synthesis," Devadas et al., 1989 International Test Conference, paper 22.1, pp. 491–500.

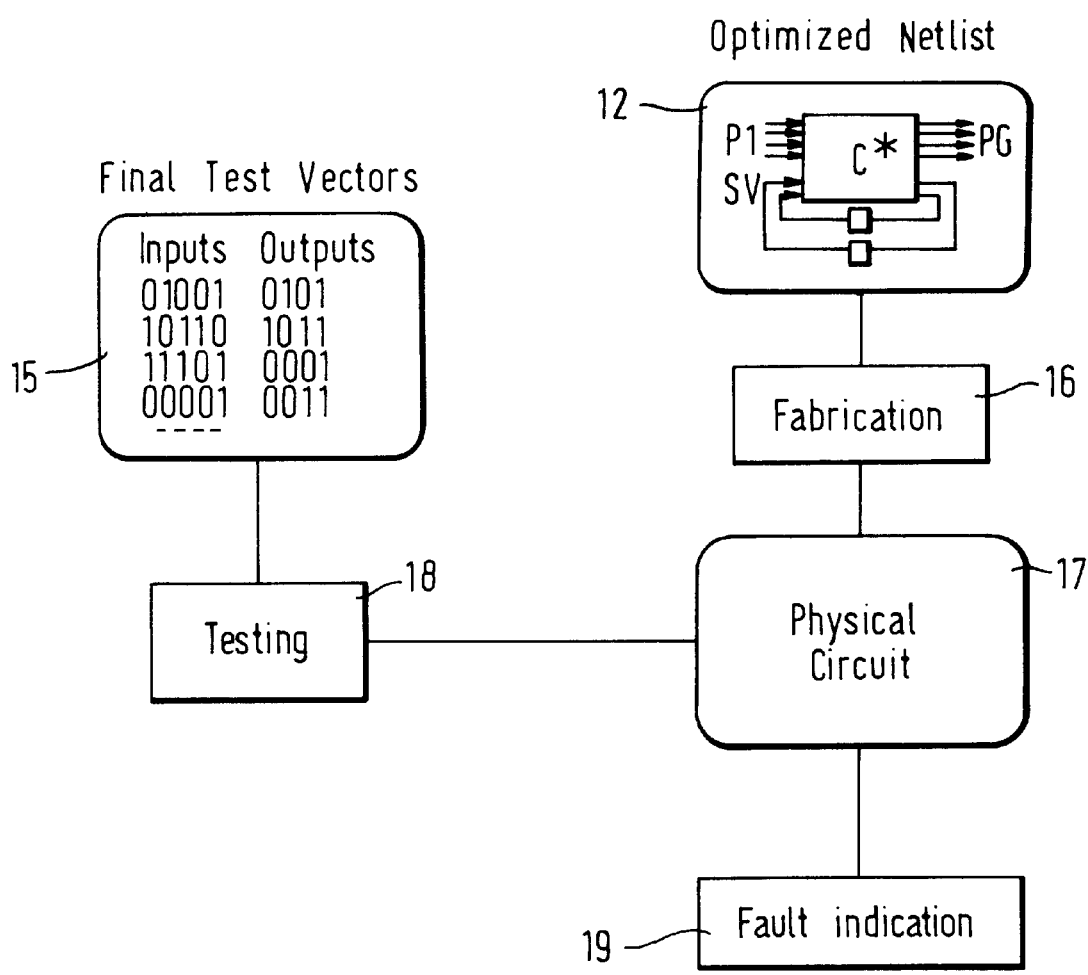

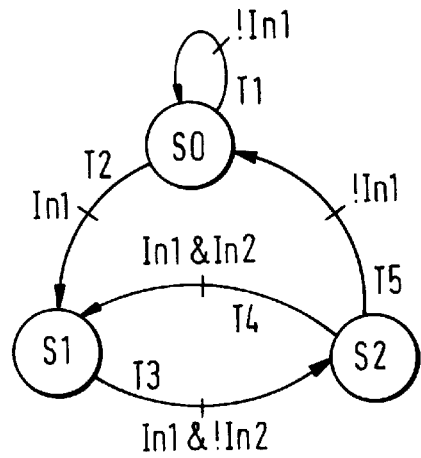
FIG.8
FIG.9
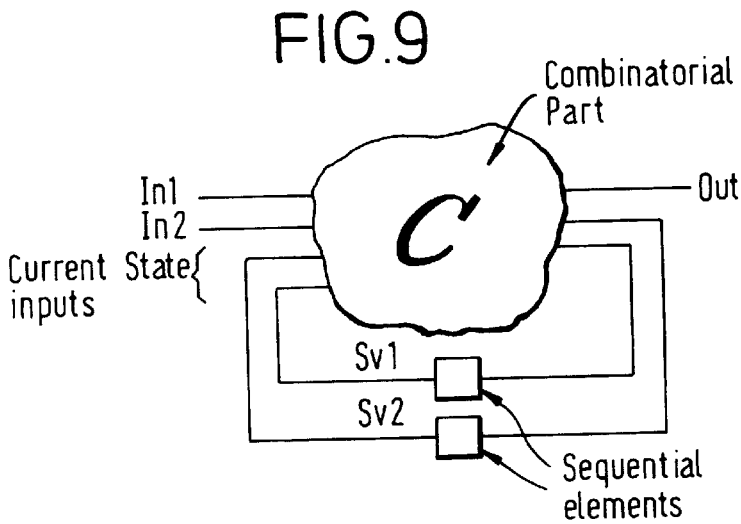
FIG.10
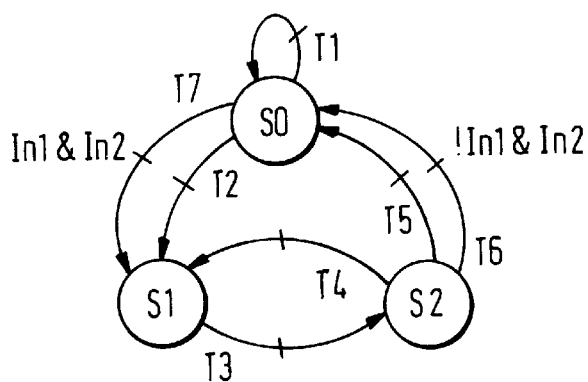

AUTOMATIC GENERATION OF TEST VECTORS FOR SEQUENTIAL CIRCUITS

This application is a continuation of Ser. No. 08/265/702 filed Jun. 24, 1994 now abandoned which is a continuation of application Ser. No. 07/745,038 filed Aug. 14, 1991, now abandoned.

FIELD OF THE INVENTION

The present invention generally relates to the design, manufacture and testing of microelectronic circuits and particularly very large scale integrated circuits. It more particularly concerns the automatic generation of test vectors for sequential circuits, i.e. circuits including delay elements such as latches or flip-flops. Such test vectors are intended for application to the finished sequential circuit and provide diagnosis of faults within the circuit.

BACKGROUND TO THE INVENTION

Various forms of large scale integrated circuits are now commonly designed with the aid of automatic programmed machines known as synthesizers or compilers. Such machines start from a high level specification of the function of, for example, a digital data processor which is to be synthesized, and proceed via various stages of minimization and optimization, usually with the aid of a library of standard cells or circuits to provide a netlist which is a detailed specification of an integrated circuit implementing, in the desired technical format, the original chosen function. Typically the circuits which are produced by such design methods comprise tens or hundreds of thousands of gates and other devices and are accordingly of a complexity far beyond the ability of a human designer to check the operation of the circuit correctly.

Much time and attention has been devoted to the generation of test vectors which will reliably diagnose faults in the finished circuit. The development of test vectors for purely combinatorial circuits is comparatively easy, but for sequential circuits has long been recognized as a difficult task.

Sequential circuits are of two types. The first type, commonly called sequential glue logic, comprises combinatorial logic blocks separated by temporal barriers, which may be of latches or flip-flops. There may be feedback loop all over the logic. A second type is represented by controllable sequencers which implement finite state machines. These controllers are commonly designed by machine synthesizers which produce very efficient circuits. The present invention is particularly concerned with the generation of test vectors from a specification of a finite state machine.

DISCUSSION OF THE STATE OF THE ART

The generation of test vectors for finite state machines is based on two main approaches.

One approach to the generation of test vectors is based on the structure of the circuit and usually employs a structural algorithm or D-algorithm such as PODEM to propagate an assumed fault condition to primary outputs and to justify the condition to primary inputs, so as to provide the test vectors. As is well known in the art and as used herein a D-algorithm envisages signals (conventionally termed D and D*) which indicate that the relevant signal is 1 and 0 respectively in the normal circuit and 0 and 1 respectively in the faulty circuit. A description of the D-algorithm and the PODEM (Path Oriented Decision Making) algorithm is given by Goel in IEEE Transactions on Computers, Volume C-30, No. 3 March 1981. For convenience herein, the term 'structural algorithm' will be used to refer to D-algorithms and derivatives such as PODEM. It will be understood that test generation for a stuck-at fault according to these algorithms is equivalent to (though does not require) solving a set of Boolean equations and is applicable only to combinatorial circuits having no delay or storage elements, so that a structural algorithm can be used only for the combinatorial part of finite state machines.

The main disadvantage of the structural generation of test vectors is therefore the need to isolate the combinatorial part of the circuit by partitioning into combinatorial blocks linked by scannable memory elements, as described by Eichelburger et al, 'A Logic Structure for Lsi Testability', Proceedings 14th Design Automation Conference, June 1977, pages 358–364.

Since the specification from which a synthesizer implements a finite state machine is essentially functional, one approach to the generation of test vectors is to generate test vectors automatically starting from the same functional specification that is being used for synthesis. Functional approaches have been investigated for some considerable time. One example is by Chantal Robach and Gabriele Saucier, 'Dynamic Testing of Control Units', IEEE Transactions on Computers Volume C-27 July 1978 pages 617–623. Another example is given by Breuer and Friedman 'Function Level Primitives in Test Generation' IEEE Transactions on Computers, Volume C-29 pages 223 and 224 March 1980. A functional approach departs from the logical level description of the circuit and in general is independent of any fault hypothesis. It leads to a functional test, which consists of identifying basic functions of the circuits and verifying their correct execution. For a finite state machine, a functional test consists of proceeding through all the transitions of the finite state machine and observing if the outputs are correct.

Devadas et al, in 1988 International Test Conference Paper 31.1 pages 621–630 and Paper 35.2 pages 730–734, describe the functional generation of test vectors of a sequential circuit modelled as either a Moore machine, in which the outputs depend only on the current state of the machine, or a Mealy machine, in which the outputs depend on the primary inputs as well as the current state of the machine.

The first of the two papers describes a synthesis procedure which produces an optimized and fully testable logic implementation of a sequential machine from a state transition graph describing the machine and indicates that the test sequences for all 'stuck-at' faults can be obtained merely by using combinatorial test generation techniques. However, the procedure requires constraints on the design of the sequential circuit. Among these constraints are the requirements that the 'output logic' and 'next state logic' blocks are all irredundant, the machine is R-reachable (i.e. all $2^n$ states are reachable from the reset state, where n is the number of latches) and either (for a Moore machine) the state of encoding of the machine is such that each pair of states asserting the same output has codes of distance –2 from each other or (for a Mealy machine) the codes of states of the machine are such that each pair of output equivalent states have codes of distance –2 from each other. In practice these constraints are substantial.

The second paper describes an 'incomplete' scan design in which using a suitable test generation algorithm test sequences are generated for a large proportion of possible faults in the sequential circuit. A subset of memory elements is found such that if these elements are made observable and controllable one can detect easily faults which are sequentially redundant or irredundant but difficult to detect. This procedure also imposes significant constraints on the design, in order to provide the necessary number of observable and controllable memory elements. These constraints in essence involve the partitioning of the overall circuit into a collection of small, combinatorial circuits, usually accomplished by replacing storage elements in the design by a scannable flip-flop.

SUMMARY OF THE INVENTION

The present invention has as its main object an improved method of generating automatically a set of test vectors for a sequential circuit of the kind which is normally designed by means of a compiler or synthesizer. The present invention is based upon a novel method which is based both on functional and structural methods.

A preferred method according to the invention comprises two main stages. In a first stage, a functional test generation method which proceeds from a functional high level specification of the circuit, provides an initial set of test vectors. This is a comparatively quick method which is independent of the fault hypothesis but does not provide a complete test coverage. In a second stage, additional test vectors for remaining possible faults, which may be revealed by fault simulation, are generated by a structural algorithm, preferably an adapted D-algorithm having a constrained input space. The two sets of test vectors, obtained by the functional generation and the structural generation are preferably combined according to the functionality of the finite state machine in order to minimize the number of test vectors.

As will be apparent, one advantage of the present invention is that a very high fault coverage of a sequential design defined in a behavioural description may be achieved. No scan path insertion or design modification is necessary. Logic redundancy introduced by combinatorial logic synthesis as well as the sequential behaviour may be completely removed while the test vector generation is performed.

BRIEF DESCRIPTION OF THE DRAWINGS

FIG. 1B is a schematic diagram illustrating the further steps of fabrication and testing in accordance with the invention.

FIG. 8 illustrates graphically one example of a finite state machine for which test vectors are to be generated.

FIG. 9 illustrates schematically the netlist for the machine illustrated in FIG. 8.

FIG. 10 illustrates graphically the finite state machine of FIG. 8, modified for the purpose of generating a final sequence of test vectors.

DETAILED DESCRIPTION OF PREFERRED IMPLEMENTATION

GENERAL PROCEDURE

Figure 1:
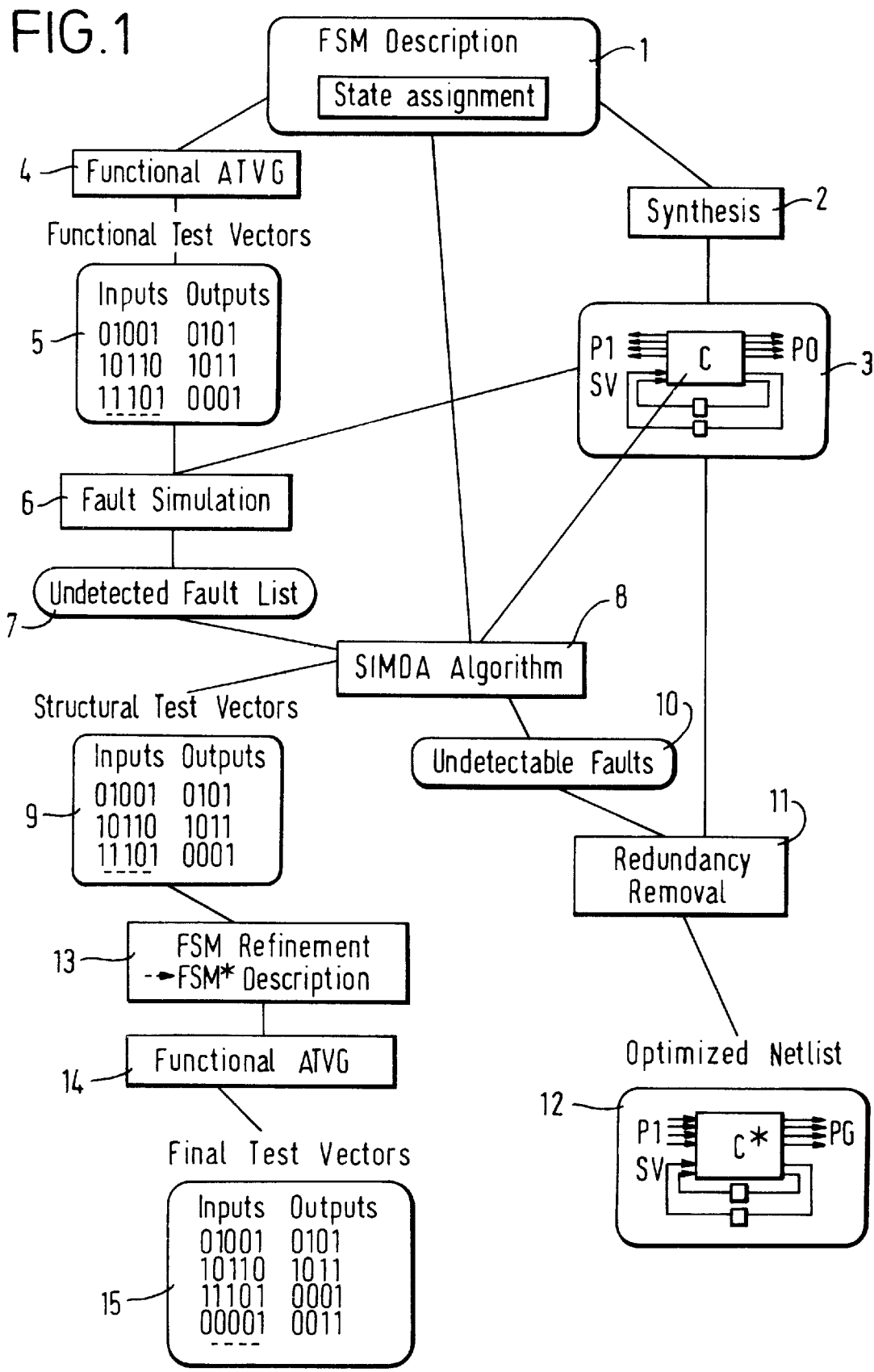
FIG. 1 is a schematic diagram illustrating a test vector generation method according to the invention.

FIG. 1 of the drawings is a general schematic diagram of a complete algorithm for the synthesis of a very large scale integrated circuit expressed in the form of an optimized netlist and beginning with a high level description, in conventional functional terms, of a finite state machine. FIG. 1 includes a procedure according to the present invention, namely the development of a set of test vectors for the diagnosis of all possible faults (expressible as an improper output from a correct input) of any component in the netlist. The associated procedure for synthesis does not form an essential part of the invention but is included for the sake of completeness.

The present invention is intended for performance with the aid of a programmed machine, such as a synthesizer or compiler, in which the algorithms described hereinafter are incorporated as program segments in the appropriate machine language. Those skilled in the art will not need any more detailed instructions for expressing these algorithms in the form of a program.

In a procedure as shown in FIG. 1, the designer begins with the description of a finite state machine. This is illustrated by stage 1 in FIG. 1. The description may be in the form of a specification of a Moore or Mealy machine.

Stage 2 in FIG. 1 represents the procedure of synthesis of a finite state machine (shown at stage 3) from the high level description. The finite state machine shown at stage 3 is now specified as a netlist defining a combinatorial block (C) and a multiplicity of flip-flops or latches. This stage in the procedure may be implemented by any of the known suitable methods of synthesis and will not therefore be described in detail. The reader is referred to any of the numerous technical papers or commercially available compilers or logic synthesizers which can define in conventional terms a finite state machine by way of a synthesis procedure.

The first stage in the development of a set of test vectors is shown by stage 4 in FIG. 1. This stage, described as 'functional ATVG' represents a stage in which there is automatic test vector generation conducted on the basis of the functional description of the machine. A preferred method of performing this stage will be described with reference to FIGS. 2 to 6.

Stage 5 in the procedure is shown as a set of functional test vectors, representing the result of the functional automatic test vector generation. These test vectors are sufficient to diagnose a proportion, which is typically at least 50% but in practice inevitably less than 100% of all the possible faults in the circuit.

Stage 6 represents a stage at which there is fault simulation. This is performed using any suitable known method on the netlist of the finite state machine. Thus, all the possible faults in the circuit are simulated and those which are identifiable by means of the functional test vectors are eliminated from the possible list of faults. This results in a list of faults (Stage 7) which cannot be detected by means of the functional test vectors.

Stage 8 in FIG. 1 represents the operation of a Simda algorithm, which is a modified form of a known D-algorithm, on the combinatorial block in order to generate test vectors covering faults not covered by the functional test generation. In order to provide an efficient procedure, the adapted D-algorithm is constrained by a limited input space, as described later.

As will be further explained hereinafter with reference to FIG. 7, the operation of the Simda algorithm in stage 8 yields two results. The first, shown in stage 9, is a list or set of test vectors which are derived by a structural analysis, in accordance with the Simda algorithm, of the circuit and is intended to develop for each of faults in the undetected fault list a respective set of test vectors.

The second result of the operation of the Simda algorithm is a list of undetectable faults, shown as stage 10. Such a list arises owing to redundancy in the originally synthesized netlist. Using known procedures, such redundancy is removed, as shown in step 11, to provide an optimized netlist 12 which, in accordance with known procedures, is used to fabricate a very large scale integrated circuit which operates in accordance with the functional description inserted by the operator in stage 1.

The procedure as thus far described provides sets of test vectors for all possible faults except those which cannot provide test vectors owing to redundancy, which can normally be eliminated.

Stage 13 indicates a refinement of the method, which provides for combining the sets of test vectors obtained by functional and structural generation. For each vector generated by the operation of the Simda algorithm there is generated a functional representation of an input value and a current state condition. These transitions are added (Stage 14) to the initial specification of the finite state machine to define a modified machine FSM*. A functional generation of test vectors (Stage 14) performed on this machine by a method corresponding to stage 4 provides a complete set of test vectors, as shown at Stage 15.

A particular example of the generation of test vectors is discussed hereinafter with reference to FIGS. 8 to 10.

FIG. 1B represents a normal continuation of the procedure illustrated in FIG. 1. The stages shown in FIG. 1B include a fabrication stage 16, by means of which the optimized netlist is implemented in the chosen technological realization, to provide a physical form 17 of the integrated circuit. This circuit is tested, as denoted by testing stage 18, using the test vectors provided at stage 15. Stage 19 denotes the fault indication which is provided in the event that output signals obtained from the application of the input signals according to the test vector sequence are incorrect.

FUNCTIONAL AUTOMATIC TEST VECTOR GENERATION

The present section deals with the performance of stages 1 to 5 of FIG. 1, i.e. the synthesis of the state machine and the functional generation of test vectors from the same high level description.

Known compilers can accept as input a Moore or Mealy machine described in a high level language description that permits the specification of the input and output variables of the machine and the finite states and transitions between them. To control the timing of the state machine signals, inputs and outputs can be synchronized using latches or RS flip-flops.

Figure 2:
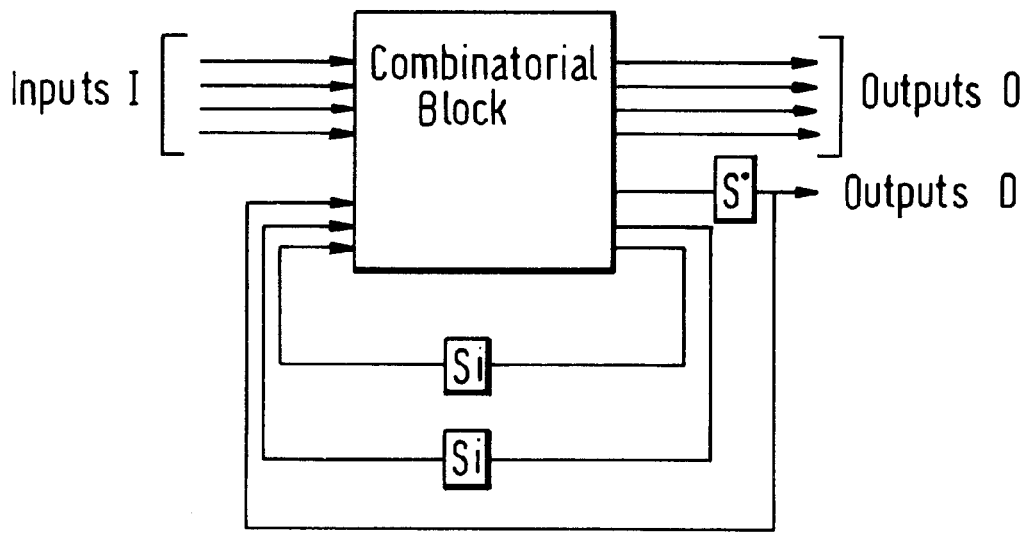
FIG. 2 is a schematic diagram of a finite state machine.
Figure 3:
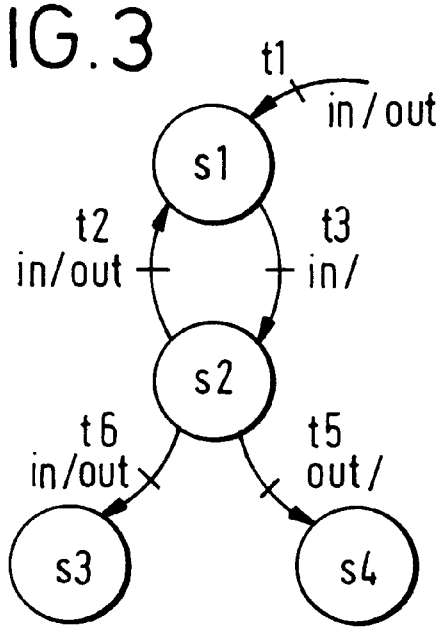
FIGS. 3 to 6 inclusive are functional schematic diagrams illustrating the generation of test vectors by means of a functional procedure.

A state machine as shown in FIG. 2 is defined by a set of input variables I, output variables O, state variables ST and with two functions dedicated to output ($\delta$) and next state ($\tau$) value computation.

$$FSM=(I, O, ST, \delta, \tau)$$

with:

$$ST_{n+1}=\delta(ST_n, I_n)$$

$$O_{n+1}=\tau(ST_n, I_n) \text{ [Mealy] or}$$

$$O_{n+1}=\delta(ST_n) \text{ [Moore]}$$

In physical terms the machine comprises a combinatorial block of which some of the outputs are each connected to a respective one of the inputs by a respective flip-flop $S_i$.

In some state machines, the state variables ST have been split into two parts: S variables encoded in a compacted manner and S* variables in a one 'hot' encoding. The outputs of a state flip-flop of S* is used both as an input and as an output of the state machine. The variables I will be called 'input variables', the variables of O 'output variables' and variables S* 'dual variables'.

Starting from this high level description, a commercially available compiler such as the VLSI FSM compiler is able to generate an optimized state encoding implemented on D, RS or JK-type flip-flops; and a minimized set of boolean expressions for each output and state variable, according to the target implementation structure (e.g. standard cell, gate array, programmable logic array).

For test purposes, each input variable is supposed to be controllable and each output variable to be observable. The test data are expressed in sequences of input variables and test outputs as sequences of output variables.

A finite state machine may be represented by an oriented graph (G) in which each node corresponds to a state and each arc to a transition between states.

The machine is assumed to be capable of reading a reset state irrespective of any single defect. In any case, if the reset state mode does not work, the diagnostic will be obvious. The assumption concerning the reset state is equivalent to the addition of 'pseudo' arcs connecting each node (state) to the reset state.

A preliminary verification aims at verifying if all the states of the control flow graph G are accessible from the reset state. This procedure verifies the functional specification of the FSM.

A state $S_i$ is accessible from the reset state if a path $(S_{Reset}, S_i)$ made of valid arcs exists in the control graph. An arc is valid if it is labelled either by input variables or by an activable dual variable. A dual variable is activable if it is possible to find a path from the reset state in which a transition sets this variable to '1'. For instance, in the graph shown in FIG. 3 the condition t5 is activable if the controller goes to state S2 then to S1 before returning to state S2.

The verification procedure consists of starting from the state $S_{Reset}$ and constructing all the possible paths using only valid arcs. The paths are constructed in parallel layer by layer. At each step the variable values (S, S*) are stocked. A path is stopped either if no valid arc can be issued from the current state or if the state (S & S*) appears already in a previous layer. The procedure is stopped either when all the states have been accessed, or when all possible transitions have been activated.

Consider as an example List 1 which sets out a description of a finite state machine:

List 1

```
reset ——> S0;
clock cp;
inputs in;              'input' variable
outputs out;            'output' variable
RS = 0 outputs S*;      'dual' variable
state S0     in         ——> S0 out S*;
             !in        ——> S1 out S*;
state S1     in         ——> S2 out !S*;
state S2     in         ——S3 !out S*;
state S3     in         ——> S4 out;
state S4     in         ——> S5;
             S*!in      ——> S5
             !S* · !in  ——> S4 !S*;
state S5     in         ——> S0,
             !in        ——> S4 !S*.
END
```

Figure 4:
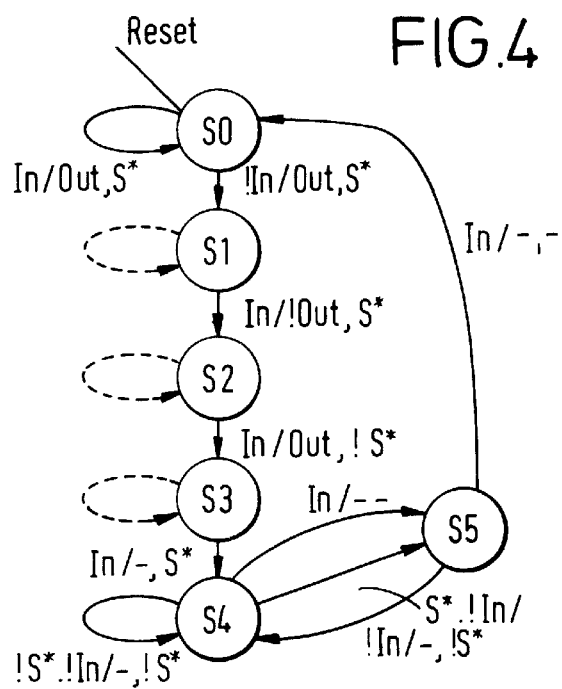

The corresponding flow graph is shown in FIG. 4.

The dotted line arrows in FIG. 4 represent transitions automatically added by the FSM compiler to have a tautology function at each state. Moreover, non-parallelism transitions from each state is verified. The 'pseudo reset' arcs are not represented.

The tree corresponding to the 'accessibility verification' procedure is constructed as follows.

At each node of the tree are stored the state and the 'dual variable' values (S, S*) as shown in Scheme 1:

Scheme 1

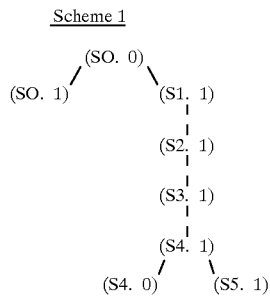

If the state machine contains inaccessible states starting from the reset state then the test generation is aborted and an error message is given to the user. If some transitions are unactivable, a warning message is given.

The goal of test vector generation is to generate a test sequence covering at least once each arc of the initial control flow graph G. The control flow graph G is reduced to a 'reduced graph' $G_R$ according to the following rule. A partial path in G which is a sequence of nodes having only one input and one output arcs is merged in one node corresponding to a 'macro-state'. In the example of FIG. 4 the reduction gives the new 'reduced graph' $G_R$ shown in FIG. 5. In this Figure, the macro-state MS1 comprises the sequences of nodes S1, S2 and S3.

Figure 6:
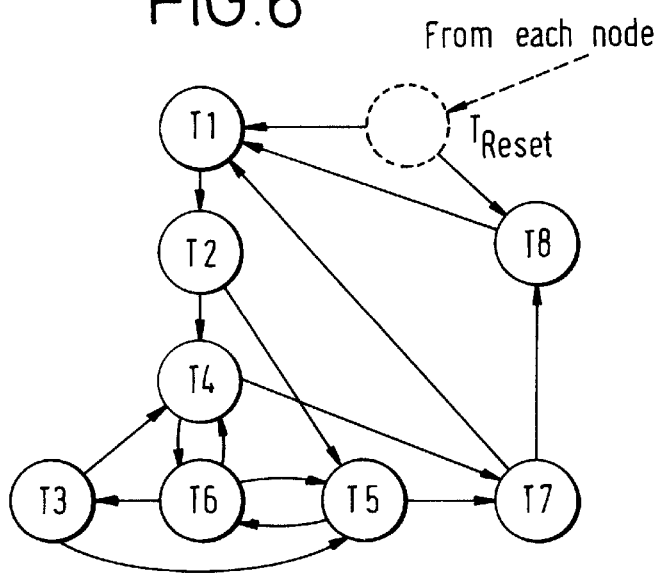

In order to construct a dual graph $G_R^*$ of the reduced graph, a set of nodes of $G_R^*$ is bijectively associated with a set of arcs of $G_R$. In $G_R^*$ an oriented arc from the node $T_i$ to the node $T_j$ is represented if in the set $G_R$ the transition $T_i$ follows the transition $T_j$. The 'pseudo reset' arcs of $G_R$ are represented in the graph $G_R^*$ by a 'pseudo node' ($T_{Reset}$) connected with all the other nodes in the graph (the reset transition can be activated after any transition in the state machine). The graph $G_R^*$ corresponding to the example in FIG. 4 is shown in FIG. 6.

The functional test vector generation algorithm works in three steps.

Firstly, in the dual reduced graph $G_R^*$, it searches for a minimal path going at least once through each node; this path is called activation arc sequence (AAS). This may be performed by a branch and bound algorithm. As in section I.3, a tree of possible paths starting from $T_{Reset}$ is built until all nodes are activated. Then, one converts this activation arc sequence into a state activated sequence (SAS) using the isomorphism properties between $G_R$ and $G_R^*$. Finally, the previous sequence of states (in $G_R$) is expanded by substituting the macro-states by their equivalent lists of states (in G). This list of activation states is converted into a set of input stimuli and output values for the whole state machine.

The generation of test vectors for the example of FIG. 1A may be represented as follows:

Arc activation sequence:
T1→T2→T4→T6→T3→T5→T7→T8

State activation sequence:
S0→MS1→S4→S5→S4→S4→S5→S0→S0

Final state activation sequence after expansion:
MS1=S1→S1→S2→S2→S3→S3

This is equivalent to:
S0→S1→S1→S2→S2→S3→S3→S4→S5→S4→
S4→S5→S0→S0

One implementation of this procedure has been made in Mainsail, a language described for example in Mainsail Language Manual, Xidak Inc., Menlo Park, Calif. (July 1987).

FAULT SIMULATION

The particular method adopted for fault simulation as prescribed by Stage 6 of the process described in FIG. 1A is not important to the present invention. A general explanation of fault simulation is given in the chapter 'Fault Simulation' of 'DIGITAL SYSTEMS TESTING AND TESTABLE DESIGN', Abramovici et al, Computer Science Press 1990, pages 131–155. As is noted therein, serial simulation is the simplest method of simulating faults, but may be undesirable for the simulation of a large number of faults owing to the consumption of excessive computing time. Parallel and deductive simulation are generally attractive but are only partially compatible with functional level modelling. However, concurrent simulation is not constrained by the system of logic values and is compatible with functional level modelling, as noted by Abramovici et al, op.cit.

STRUCTURAL MODE OF GENERATION OF TEST VECTORS

Figure 5:
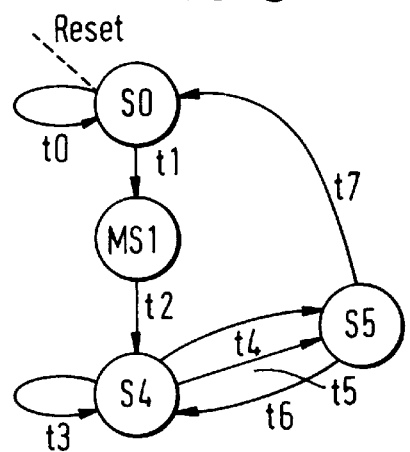
Figure 7:
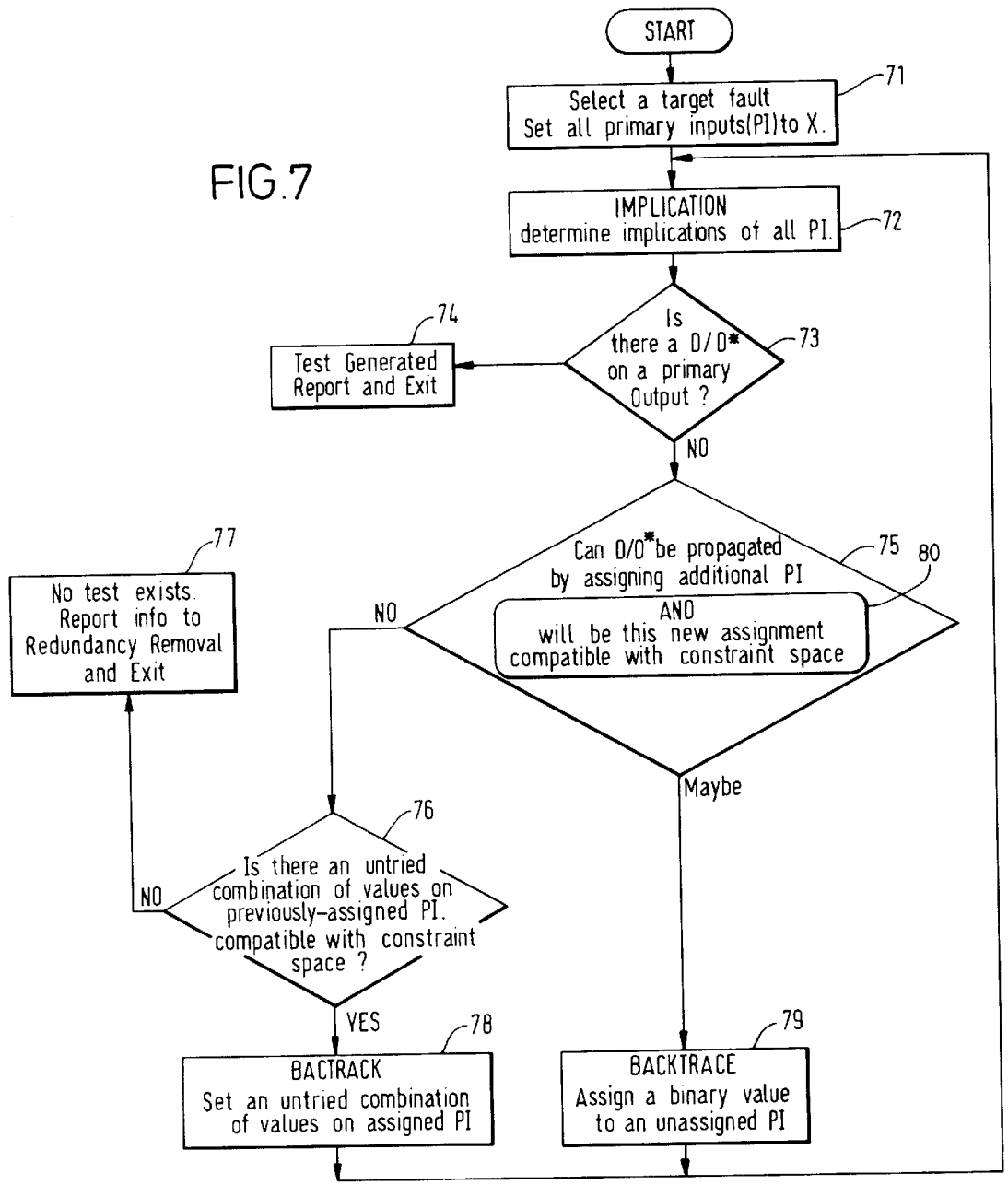
FIG. 7 is a flow chart of a modified D-algorithm according to the present invention.

Reference in this section is made to FIG. 7, which illustrates Stage 8 of FIG. 1, and is a flow chart of the Simda algorithm. For the most part the algorithm resembles that shown in Goel et al, op.cit. FIG. 5, which relies on the PODEM algorithm.

FIG. 7 proceeds from the selection of a target fault (Stage 71). This target fault is one of the target faults given by the list of undetected faults, represented by Stage 7 of FIG. 1. For each such target fault all primary inputs are set to the unassigned value of X (don't care).

The next Stage (72) is the 'implication' stage, to determine implications of all the primary inputs.

Stage (73) is a detection stage to determine whether there is a D or D* signal on a primary output. If there is, a test vector has been generated for the target fault (Stage 74).

If, which is more likely, there is no such primary output, the method proceeds to Stage 75 which determines whether a D or D* signal can be propagated by assigning an additional primary input. If the answer to this enquiry is negative the procedure goes to Stage 76 which determines whether there is an untried combination of values on previously assigned primary inputs. If the result of this determination is negative, then no test exists so that there is a report (Stage 77) to the redundancy removal stage. If there is such an untried combination then there is a backtrack Stage (78) in which an untried combination of values is applied to an unassigned primary input. This stage leads to a reperformance of the implication Stage 72.

If however a D/D* signal can be propagated by assigning additional primary inputs, then a backtrace (Stage 79) is applied to assign a binary value to an unassigned primary input. The procedure then reverts to Stage 72.

The modification of the Podem algorithm to the Simda is the additional constraint implied by block 80 within Stage 75 which determines whether the new assignment of additional primary inputs will be compatible with the constraint space. It will be recalled that there has already been a partial generation of test vectors by means of the functional procedure demonstrated in Stages 3 to 7. This removes many of the possibilities for test vector generation and so removes the possible number of test vector values that the program has to consider. This is equivalent to constraining the space for choice of test vectors.

The inputs for the adapted D-algorithm is composed of ({PI}+{SV}) where {PI} means the cardinality of the set of primary inputs and {SV} has a similar meaning in respect of internal state variables. The exhaustive set of input values for the combinatorial block is equal to $2^{**}$ ({PI}+{SV}).

If the state machine is encoded with {SV} bits, the input configurations corresponding to the undefined states, namely $2^{**}$ ({SV}-{ST}), would never be applied to the combinatorial block. Accordingly, the flow of the adapted algorithm requires a constraint on the new assigned input values needed to detect a 'stuck at' fault in the combinatorial circuit.

If, for a given fault, no compatible input vector has been found, there is by implication a sequential logic redundancy. Such redundancies can readily be removed by for example the technique described by Devedas et al, 'Redundancies and Don't Cares in 'Sequential Logic Synthesis', Paper 22.1, 1989 International Test Conference pages 491 to 500.

A SPECIFIC EXAMPLE

The following is a comparatively simple example to illustrate the techniques characteristic of the invention.

Let us consider the state machine described in List 2 below:

---
List 2
---
State-Machine Example;
inputs In1, In2;
outputs Out;
Reset --> S0;
State S0
    In1                   -->        State S1, Out = 0
    !In1                 -->        State S0, Out = 1;
State S1
    In1 & !IN2     -->        State S2, Out = 1;
State S2
    In1 & In2      -->        State S1, Out = 0;
    !In1                 -->        State S0, Out = 1;
end.

---

This state machine can be graphically represented as shown in FIG. 8.

Starting from the FSM description and just before the synthesis process, the algorithm assigns to each symbolic state Si a binary value coded on [Sv] bits (state encoding step). A minimum of two state bits are necessary to encode the 3 states of the example.

The state assignment will be for example:

|  | Sv1 | Sv2 |
|---|---|---|
| S0 Binary code = | 0 | 0 |
| S1 Binary code = | 0 | 1 |
| S2 Binary code = | 1 | 0 |

Accordingly, the un-assigned binary code (Sv1=1 and Sv2=1) is impossible to set.

The synthesis Stage 2 in FIG. 1 will generate a netlist which can be schematically represented as shown in FIG. 9.

The netlist consists of a combinatorial block C which in this example has two primary inputs (In1 and In2), a single primary output (Out) and two 'current state' inputs provided by the sequential (delay) elements. The set ST of state values for the machine is {S0, S1, S2} so that the cardinality [ST] of the set ST is 3. The set [Sv] of state variables is {Sv1, Sv2}. The cardinality of the set [Sv] is 2, so that the maximum possible number of encoded states, i.e. $2^{**}$[Sv] is equal to four.

According to step 4 in FIG. 1, a functional automatic test vector generation will generate a test set which drives the state machine through each transition at least once in the graph shown in FIG. 7. This test will be for example as shown in the Table 1 below.

TABLE 1

| | Inputs | | |
|---|---|---|---|
| Current State | In1 | In2 | Transition Achieved |
| S0 | 0 | 0 | T1 |
| S0 | 1 | 0 | T2 |
| S1 | 1 | 0 | T3 |
| S2 | 1 | 1 | T4 |
| S1 | 1 | 0 | T3 |
| S2 | 0 | 0 | T5 |

Then these input values are used to run a fault simulation of the state machine (FIG. 1, Stage 6).

The fault simulation gives a list of undetected faults (FIG. 1, Stage 7). These faults correspond to possible defaults in the combinatorial part (stuck-at-one and stuck-at-zero of inputs or output gates) which will not be detected by the first set of vectors. Then, the purpose of the D-algorithm is to find input values for the combinatorial block C to detect these faults. Because of the structure of the generated netlist, some inputs of the combinatorial block are not directly accessible. In the example, the only way to set specific values on Sv1 and Sv2 inputs is to drive the state machine in the state whose code correspond to the needed values. And, because the state machine has a number of states not equal to $2^{**}$[Sv], some combinations of input values are impossible to set as inputs of the block C: the values Sv1=1 and SV2=1 will be impossible to apply to the combinatorial block. Consequently, a D-algorithm compatible with a constrained space of input values is needed.

After generating test vectors to detect remaining faults in the combinatorial C, the modified D-algorithm gives a new set of additional test vectors.

Let us imagine that for the example the new set of 'structural' test vectors contains the structural vectors of Table 2.

TABLE 2

| In1 | IN2 | Sv1 | Sv2 | |
|---|---|---|---|---|
| 1 | 1 | 0 | 0 | structural vector 1 |
| 0 | 1 | 1 | 0 | structural vector 2 |

These input vectors are now added to the initial set of functional vectors; this addition of vectors does not alter the functionality of the finite state machine.

For the structural vector 1, it is necessary to drive the state machine in the state S0 (which has a code which corresponds to Sv1=0 and Sv2=0) and to apply the input values In1=1 and In2=1.

For the structural vector 2, it is necessary to drive the state machine in the state S2 (code of S2: Sv1=1 and Sv2=0) and to apply the input values In1=0 and IN2=1.

To do that efficiently, there is constructed a refinement of the initial FSM description (FIG. 1, step 13) by adding explicitly each state involved (here S0 and S2) the new transitions with the necessary input conditions. Thereafter, one may apply a functional ATVG to the modified State Machine description in order to get the final test sequence.

Then the new description FSM* is as shown in List 3.

---
List 3
---

```
State-Machine Example;
inputs In1, In2;
outputs Out;
Reset --> S0;
State S0
    In1           -->   State S1, Out = 0;
    In1 & In2     -->   State S1, Out = 0;    <--   Needed
    !In1          -->   State S0, Out = 1;          by Sv1
State S1
    In1 & !In2    -->   State S2, Out = 1;
State S2
    In1 & In2     -->   State S1, Out = 0;
    !In1          -->   State S0, Out = 1;
    !In1 & In2    -->   State S0, Out = 1;    <--   Needed
                                                    by Sv2
end.
```

The description can be graphically represented as shown in FIG. 10.

In this new description, some transitions are logically redundant; they do not change the functionality of the machine but they are needed to test it efficiently.

The functional ATVG procedure when applied to this new description gives a new set of functional test vectors which drive the new FSM* state machine through all the transitions.

The example will give a final sequence of test vectors as set forth in Table 3.

TABLE 3

| | Inputs | | |
|---|---|---|---|
| Current State | In1 | In2 | Transition Activated |
| S0 | 0 | 0 | T1 |
| S0 | 1 | 0 | T2 |
| S1 | 1 | 0 | T3 |
| S2 | 1 | 1 | T4 |
| S1 | 1 | 0 | T3 |
| S2 | 0 | 0 | T5 |
| S0 | 1 | 1 | T6 |
| S1 | 1 | 0 | T3 |
| S2 | 0 | 1 | T7 |

In this sequence, the transitions T6 and T7 have been added by virtue of the state variables Sv1 and Sv2.

In the foregoing, a method of generating test vectors for a sequential circuit expressible as a finite state machine has been described. Starting from a high level description of the machine, a functional test generation provides a sequence of test vectors for some but not all the possible faults. A structural test generation performed on the combinatorial part of the finite state machine provides test vectors for the remaining possible faults except those which are untestable owing to logic redundancy. The description of the machine is modified in accordance with additional state transitions corresponding to the structurally generated vectors and a functional generation on the modified description of the state machine, yields a final set of test vectors.

We claim:

1. A method of automatically generating test vectors for testing a sequential circuit, said sequential circuit implementing a finite state machine which comprises a combinatorial part and sequential elements, said method comprising the steps of:

providing a functional specification of the sequential circuit, said functional specification defining said finite state machine;

generating automatically a first set of test vectors from said functional specification, said first set of vectors enabling testing of less than all possible faults in said circuit;

synthesizing automatically the functional specification of the sequential circuit; and applying automatically to said combinatorial part a structural algorithm to generate a second set of test vectors, the test vectors in said second set of test vectors enabling testing of at least a portion of the faults which can occur in said circuit and which are not testable by test vectors in said first set of test vectors.

2. A method of automatically generating test vectors for testing a sequential circuit, said sequential circuit implementing a finite state machine comprising a combinatorial part and sequential elements, said method comprising the steps of:

providing a functional specification of the sequential circuit, said functional specification defining said finite state machine;

generating automatically a first set of test vectors from said functional specification, said test vectors in said first set of test vectors enabling testing of less than all possible faults in said sequential circuit;

synthesizing automatically from said functional specification of said finite state machine;

determining automatically a set of possible faults which can be exhibited in the circuit and which are not testable by any test vector in said first set of test vectors; and applying automatically to said combinatorial part a structural algorithm to generate a second set of test vectors, the test vectors in said second set of test vectors enabling testing of at least some of said set of possible faults.

3. A method according to claim 2 further comprising:

establishing automatically for each test vector in said second set of test vectors a respective transitional state for said finite state machine;

modifying automatically said functional specification by adding each said respective transitional state to said functional specification to produce a modified specification which includes each said respective transitional state; and generating automatically from said modified specification a third set of test vectors functionally equivalent to the first and second sets of test vectors whereby to minimize the total number of test vectors required for testing said sequential circuit.

4. A method according to claim 2 wherein for each of said possible faults which can be exhibited in the circuit, said structural algorithm generates a test vector of said second set of test vectors by detecting whether the respective possible fault condition can be propagated to an output of the combinatorial part.

5. A method according to claim 4 wherein the finite state machine has a multiplicity of states not equal to 2**[SV] wherein [SSV] is the cardinality of the set of state variables for the machine and wherein the input space for the algorithm is constrained to exclude input signal values which cannot validly be applied to the combinatorial part.

6. A method according to claim 2 and further comprising:

fabricating an integrated circuit including said sequential circuit; and testing the fabricated circuit with test vectors obtained from said generating and applying steps.

7. A method according to claim 6 further comprising:

establishing automatically for each test vector in said second set of test vectors a respective transitional state for said finite state machine;

modifying automatically said functional specification by adding each said respective transitional state to said functional specification to produce a modified specification; and generating automatically from said modified specification a third set of test vectors functionally equivalent to the first and second sets of test vectors whereby to minimize the total number of test vectors required for testing said sequential circuit.

8. A method according to claim 6 wherein the step of performing a structural generation comprises applying an algorithm which for each of said possible faults which can be exhibited in the circuit, provides a test vector of said second set of test vectors by detecting whether if the respective possible fault condition can be propagated to an output of the combinatorial part.

9. A method according to claim 8 wherein the finite state machine has a multiplicity of states not equal to 2**[SV] wherein [SV] is the cardinality of the set of state variables for the machine and wherein the input space for the algorithm is constrained to exclude input signal values which cannot validly be applied to the combinatorial part.

* * * * *